United States Patent [19]
Usami et al.

[11] Patent Number: 5,010,258
[45] Date of Patent: Apr. 23, 1991

[54] PROGRAMABLE LOGIC ARRAY USING ONE CONTROL CLOCK SIGNAL

[75] Inventors: Kimiyoshi Usami, Yokohama; Aya Ishii, Tokyo, both of Japan

[73] Assignee: Kabushiki Kaisha Toshiba, Kawasaki, Japan

[21] Appl. No.: 406,099

[22] Filed: Sep. 12, 1989

[51] Int. Cl.$^5$ .......................................... H03R 19/096
[52] U.S. Cl. .................................. 307/469; 307/443; 307/481
[58] Field of Search ............... 307/443, 448, 465, 468, 307/469, 452, 481

[56] References Cited
U.S. PATENT DOCUMENTS

| | | | |
|---|---|---|---|
| 4,611,133 | 9/1986 | Peterson et al. | 307/443 X |
| 4,697,105 | 9/1987 | Moy | 307/465 |
| 4,764,691 | 8/1988 | Jochem | 307/465 X |
| 4,894,564 | 1/1990 | Sakarsita et al. | 307/465 |

*Primary Examiner*—David Hudspeth
*Attorney, Agent, or Firm*—Foley & Lardner

[57] ABSTRACT

A programmable logic array PLA is operated under control of a single-phase clock in which a fixed current does not flow in one of an AND array and an OR array in the PLA while the other of the AND array and the OR array is precharged. Thus, this PLA can realize low consumption of electric power and a high clock frequency, thereby enabling high-speed operation.

8 Claims, 10 Drawing Sheets

PROGRAMABLE LOGIC ARRAY USING ONE CONTROL CLOCK SIGNAL

BACKGROUND OF THE INVENTION

1. Field of the Invention

The present invention relates to a programable logic array (PLA), and particularly to the composition of such a PLA.

2. Description of the Prior Art

A PLA is mainly used for a control circuit or a decoder circuit in a logic large scale integrated circuit (LSI).

Figure 1:
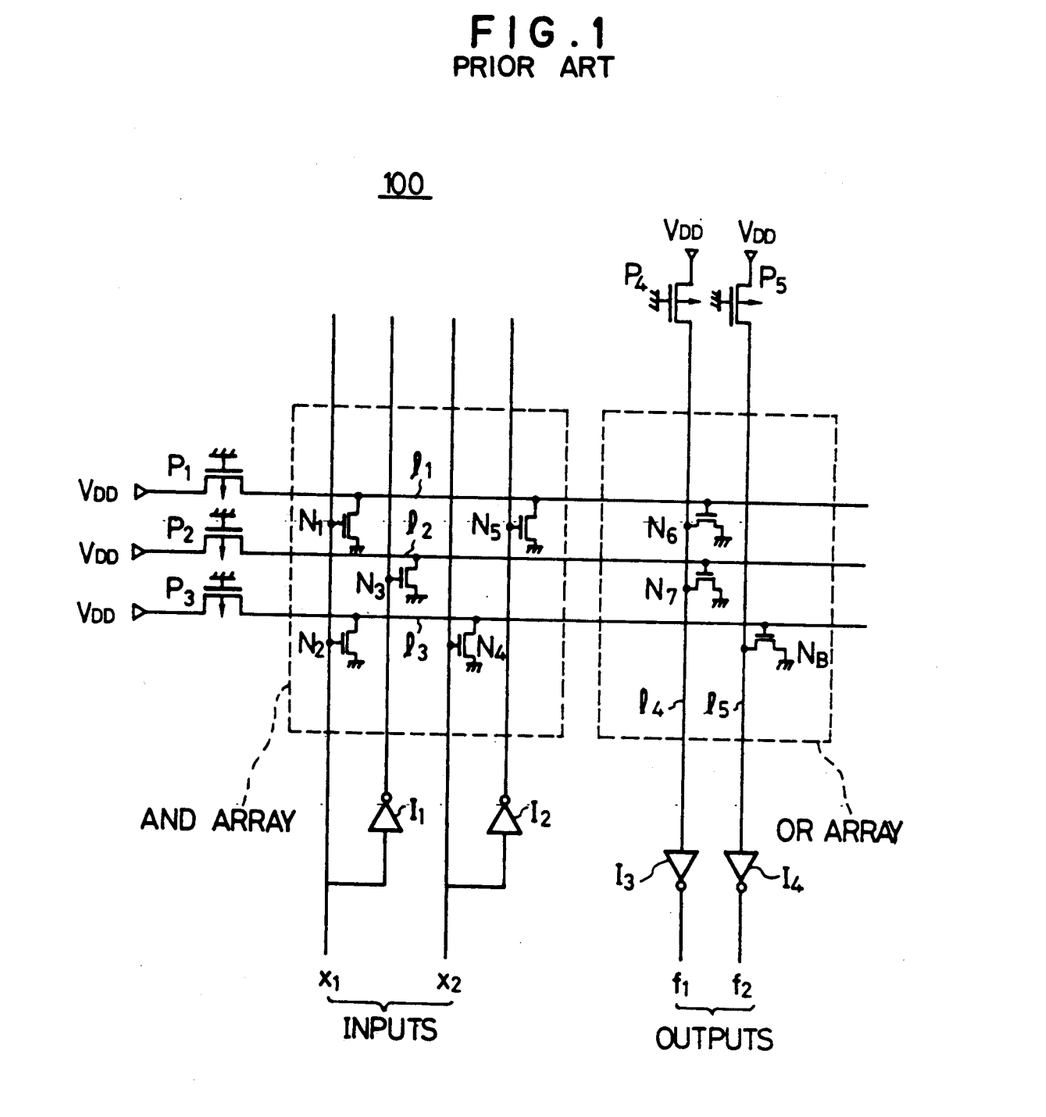
FIG. 1 is a diagram of PLA which is used conventionally.

FIG. 1 is a diagram of PLA 100 which is used conventionally. In this diagram, reference characters $P_1$, $P_2$, $P_3$, $P_4$ and $P_5$ designate P channel MOS transistors (PMOS transistors), and $N_1$, $N_2$, $N_3$, ... and $N_8$ designate N channel MOS transistors (NMOS transistors). To one end terminal (source) of each PMOS transistor is connected a power source $V_{DD}$. Some of the NMOS transistors comprise an AND array and the others comprise an OR array. PLA 100 is mainly comprised of PMOS and NMOS transistors, product term lines $l_1$, $l_2$, $l_3$ and output lines $l_4$, $l_5$ which respectively connect these transistors.

Next, the operation of PLA 100 will be described. The gate terminal of each PMOS transistor is grounded. Thus, the PMOS transistors act as load transistors for the product term lines $l_1$, $l_2$, $l_3$ of the AND array and the output lines $l_4$, $l_5$ of the OR array. Accordingly, each level of the product term lines $l_1$, $l_2$, $l_3$ is determined in the AND array by levels of inputs $x_1$, $x_2$. Each level of the product term lines $l_1$, $l_2$, $l_3$ is transmitted to the OR array. Thereby, levels of the output lines $l_4$, $l_5$ are determined, and outputs $f_1$, $f_2$ are obtained. In this case, a stationary current (direct current) flows from each power source $V_{DD}$ to the ground while the product term lines $l_1$, $l_2$, $l_3$ and the output lines $l_4$, $l_5$ are at a LOW (L) level. For example, when the input $x_1$ is at a HIGH (H) level, the NMOS transistor $N_1$ is ON. As a result, a fired current flows from the power source $V_{DD}$ to the ground connected to one end terminal of the NMOS transistor $N_1$ through the PMOS transistor $P_1$.

Thus, a fixed current flows from each power source $V_{DD}$ to the ground, while the terminal term lines and the output lines are at L level.

Accordingly, consumption of electric power in the entire PLA 100 becomes excessive.

Figure 2:
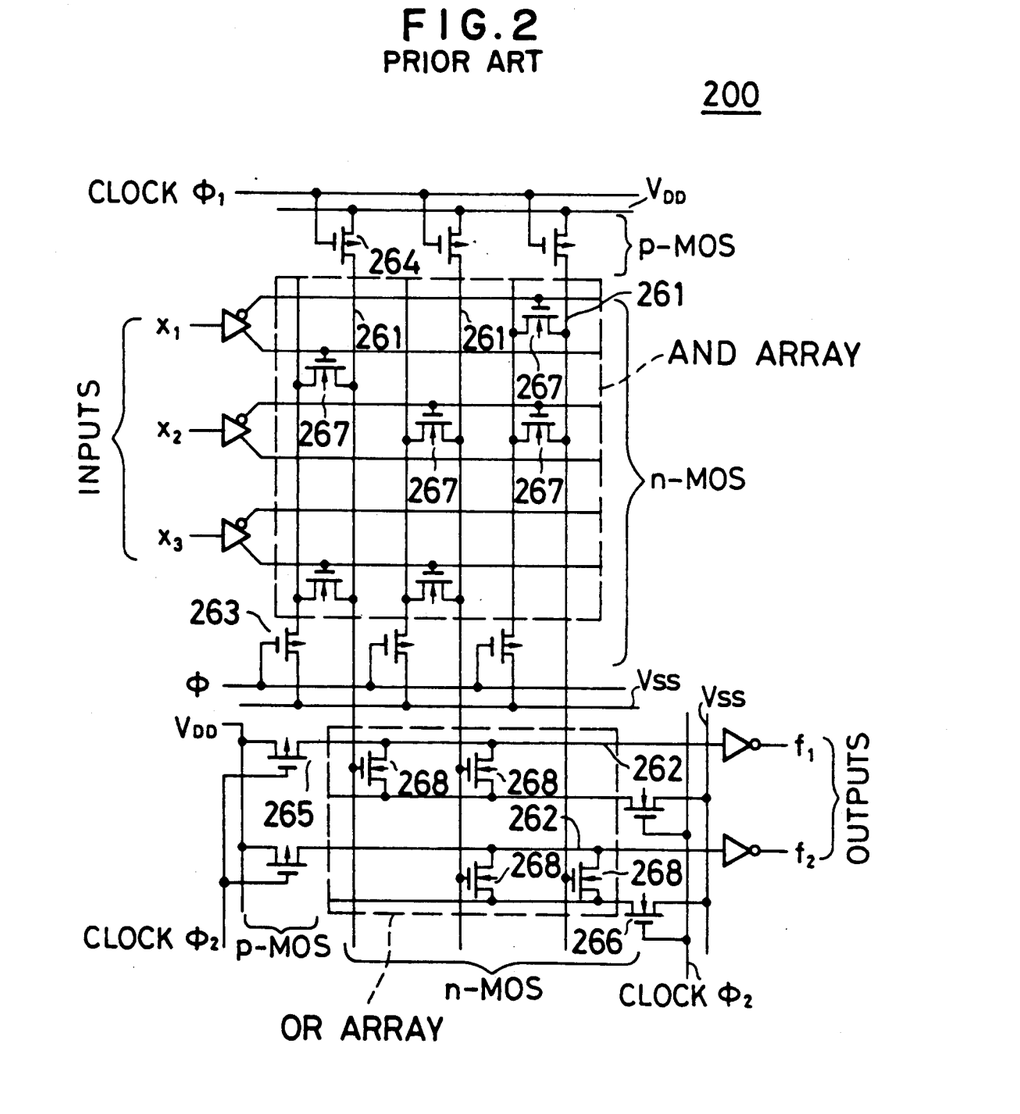
FIG. 2 is a diagram of a synchronous PLA system which is used conventionally.

FIG. 2 shows a diagram of a synchronous PLA system 200 which is used conventionally. In this diagram, reference characters $\phi_1$, $\phi_2$ designate clocks for controlling operation of PLA 200, and these have respectively different phases. An AND array mainly comprises of product term lines 261 and NMOS transistors 267. While an OR array mainly comprises output lines 262 and NMOS transistors 268.

Figure 3:
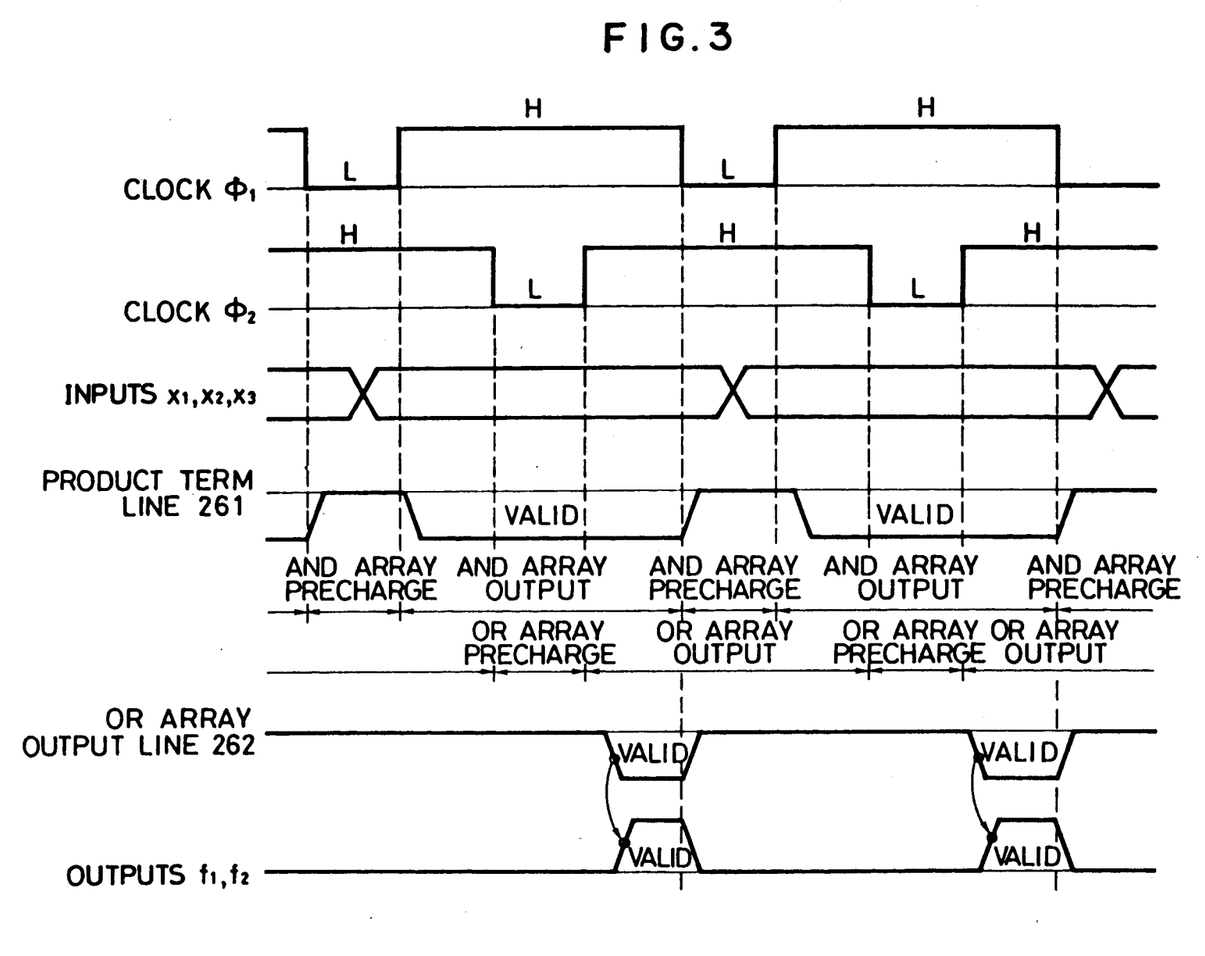
FIG. 3 is a timing chart to show operation of the synchronous PLA system shown in FIG. 2.

Next, operation of the synchronous PLA system 200 having the above composition will be described with reference to a timing chart shown in FIG. 3.

First, the clock $\phi_1$ goes to the L level, and precharge of the product term lines 261 is performed. Then, the clock $\phi_1$ goes to the H level, and the output of the product term lines 261 is provided. Thereafter, the clock $\phi_2$ goes to the L level, and precharge of the output lines 262 is performed. Subsequently, the clock $\phi_2$ go to the H level, and the output of the output lines 262 is provided. As the result, outputs $f_1$ and $f_2$ are obtained.

In such a manner, the precharge and discharge (output) of the product term lines 261 and the output lines 262 occur respectively by using the clocks $\phi_1$, $\phi_2$ having different phases.

As compared with PLA 100 shown in FIG. 1, the synchronous PLA system 200 is such that a fixed current does not flow from the power source $V_{DD}$ to the ground. Thus, the system has the advantage that consumption of electric power to be used therein can be reduced. However, the synchronous PLA system 200 requires clocks $\phi_1$, $\phi_2$ of two phases, and the two phases of the clocks should be set so as to not be the same. Particularly, in a microprocessor which requires high-speed operation, the frequencies of the clocks should be made higher. However, in such a case, it is technically difficult to shorten the clock periods of the clocks $\phi_1$, $\phi_2$ without making the phases close to each other.

SUMMARY OF THE INVENTION

In order to solve the above problems, it is therefore an object of the present invention to provide a PLA having a simple circuit construction and high-speed operation.

It is another object of the present invention to provide a PLA which can reduce the consumption of electric power.

In order to achieve these objects, in a PLA of the present invention, its high-speed operation is realized by making the clock frequencies higher and using single-phase clocks.

Moreover, the PLA is so constructed that a fixed current does not flow in one of the AND array and the OR array thereof while the other of the AND array and the OR array is precharged.

These and other objects, features and advantages of the present invention will be more apparent from the following description of a preferred embodiment, taken in conjunction with the accompanying drawings.

DETAILED DESCRIPTION OF THE EMBODIMENTS

Figure 4:
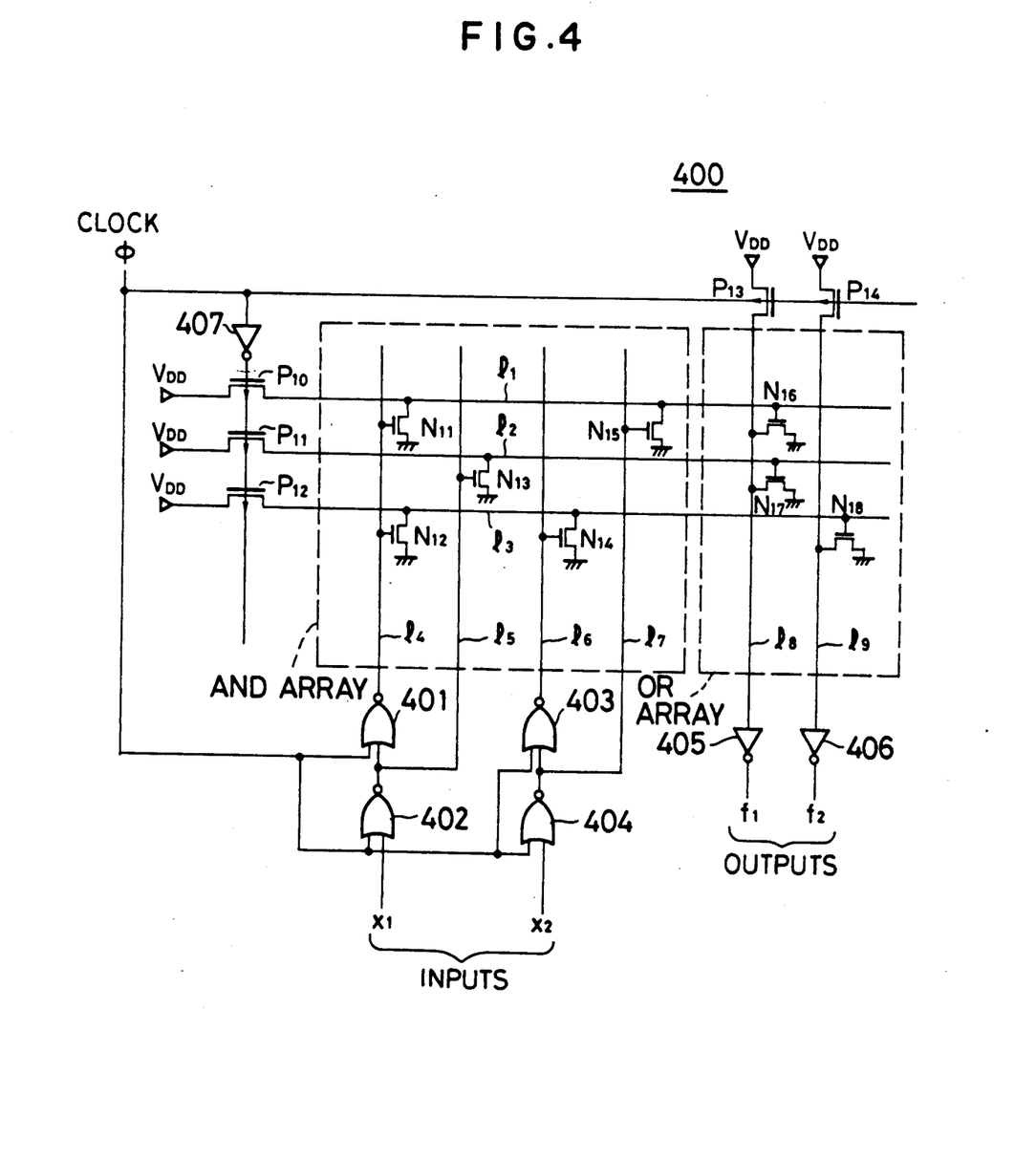
FIG. 4 is a diagram of a PLA which is a first embodiment of the present invention.

FIG. 4 is a diagram of PLA 400 which is a first embodiment of the present invention.

In this diagram, reference characters $P_{10}$, $P_{11}$, $P_{12}$, $P_{13}$ and $P_{14}$ designate PMOS transistors, and $N_{11}$, $N_{12}$, .. $N_{17}$ and $N_{18}$ designate NMOS transistors, respectively, while, reference numerals 401, 402, 403 and 404 indicate NOR gates, and 405, 406, 407 indicate inverters. Further, $V_{DD}$ means a power source, and $\phi$ means a single-phase control clock. Each gate of the NMOS transistors $N_{11}$ to $N_{15}$ is connected to one of the input lines $l_4$ to $l_7$ in an AND array.

Thus, inputs $x_1$, $x_2$ are inputted into the AND array of PLA 400 through the NOR gates 401, 402, 403 and 404.

These NOR gates are controlled by the clock $\phi$.

Figure 5:
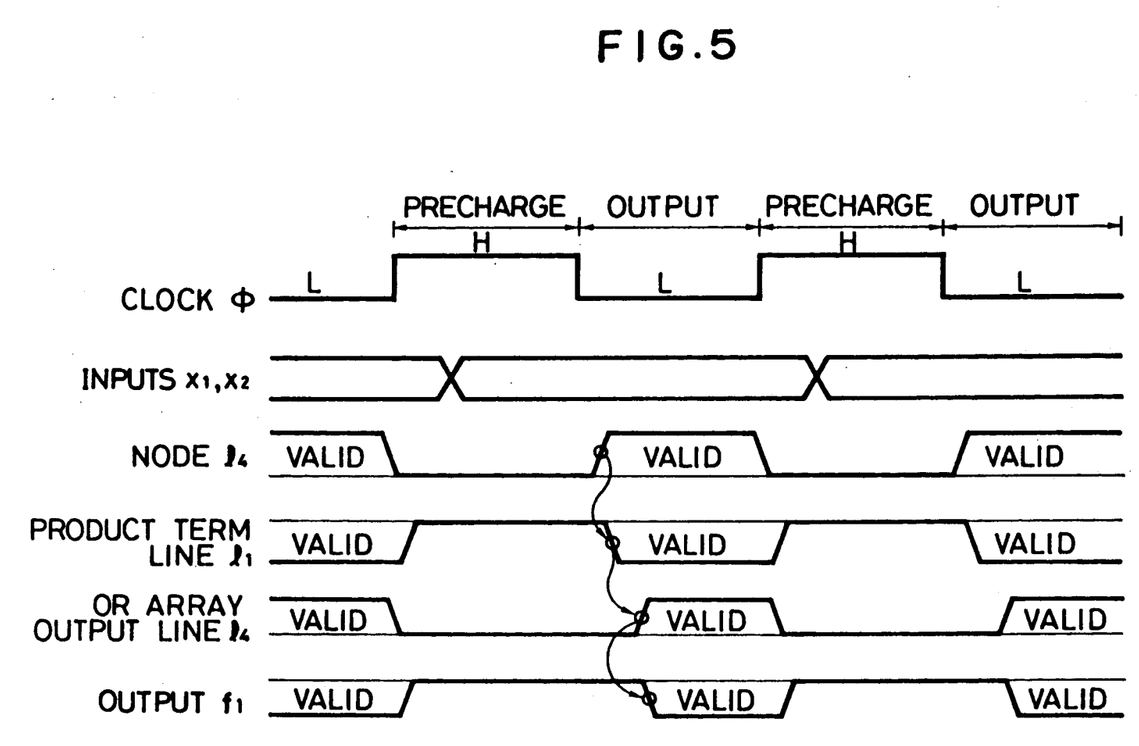
FIG. 5 is a timing chart to show operation of the PLA shown in FIG. 4.

Hereinafter, operation of PLA 400 having the above construction will be described with reference to a timing chart shown in FIG. 5. When the control clock $\phi$ is at the H level, the output of the NOR gates 401 to 404 is at the L level. Thus, each of the NMOS transistors does not go ON irrespective of the states of inputs $x_1$, $x_2$. Since the control clock $\phi$ supplies the L level (inverted clock $\bar{\phi}$) to each gate of the PMOS transistors $P_{10}$, $P_{11}$ and $P_{12}$ through the inverter 407, these PMOS transistors turn ON. Accordingly, the NMOS transistors are precharged through the product term lines $l_1$, $l_2$ and $l_3$.

Also in the state of the H level of the clock $\phi$, PMOS transistors $P_{13}$ and $P_{14}$ are OFF. Therefore, the NMOS transistors $N_{16}$, $N_{17}$, $N_{18}$ in the OR array turn ON through the respective product term lines $l_1$, $l_2$ and $l_3$. Thus, output lines $l_8$ and $l_9$ go to the L level. Moreover, since PMOS transistors $P_{13}$ and $P_{14}$ are OFF, a direct current does not flow in the AND array and the OR array during the precharge.

Next, when the clock $\phi$ changes from the H level to the L level, the contents of the inputs $x_1$, $x_2$ are input into the input lines $l_4$, $l_5$, $l_6$ and $l_7$ through the NOR gates 401 to 404. Accordingly, each the gate of the PMOS transistors $P_{10}$, $P_{11}$ and $P_{12}$ is provided an H level through the inverter 407, and these transistors turn OFF. Thus, the NMOS transistors $N_{11}$ to $N_{15}$ turn ON or OFF in accordance with the contents of the inputs $x_1$, $x_2$ and inversion logic $\bar{x}_1$, $\bar{x}_2$ thereof. Thereby, the product term lines $l_1$, $l_2$, $l_3$ carry out either discharge or charge holding. Moreover, an L or H level of the product term lines is transmitted to the OR array, and the NMOS transistors $N_{16}$, $N_{17}$, $N_{18}$ turn ON or OFF. PMOS transistors $P_{13}$, $P_{14}$ go ON when the clock $\phi$ is at the L level. For example, on the supposition that the NMOS transistor $N_{16}$ is ON, a direct current from the power source $V_{DD}$ flows from the drain terminal of the NMOS transistor $N_{18}$ to the ground of the source terminal (electrode) thereof. Thus, the output line $l_8$ is at the L level determined by the ratio of ON resistance values of the PMOS transistor $P_{13}$ and the NMOS transistor $N_{16}$.

When the NMOS transistors $N_{16}$ and $N_{17}$ are OFF, the output line $l_8$ is charged through the PMOS transistor $P_{13}$ in the ON state, and goes to the H level. As a result, the levels of the output lines $l_8$, $l_9$ are determined as corresponding to the states of the NMOS transistors $N_{16}$, $N_{17}$, $N_{18}$ in the OR array, and outputs $f_1$, $f_2$ are outputted through the inverters 405, 406.

Figure 6:
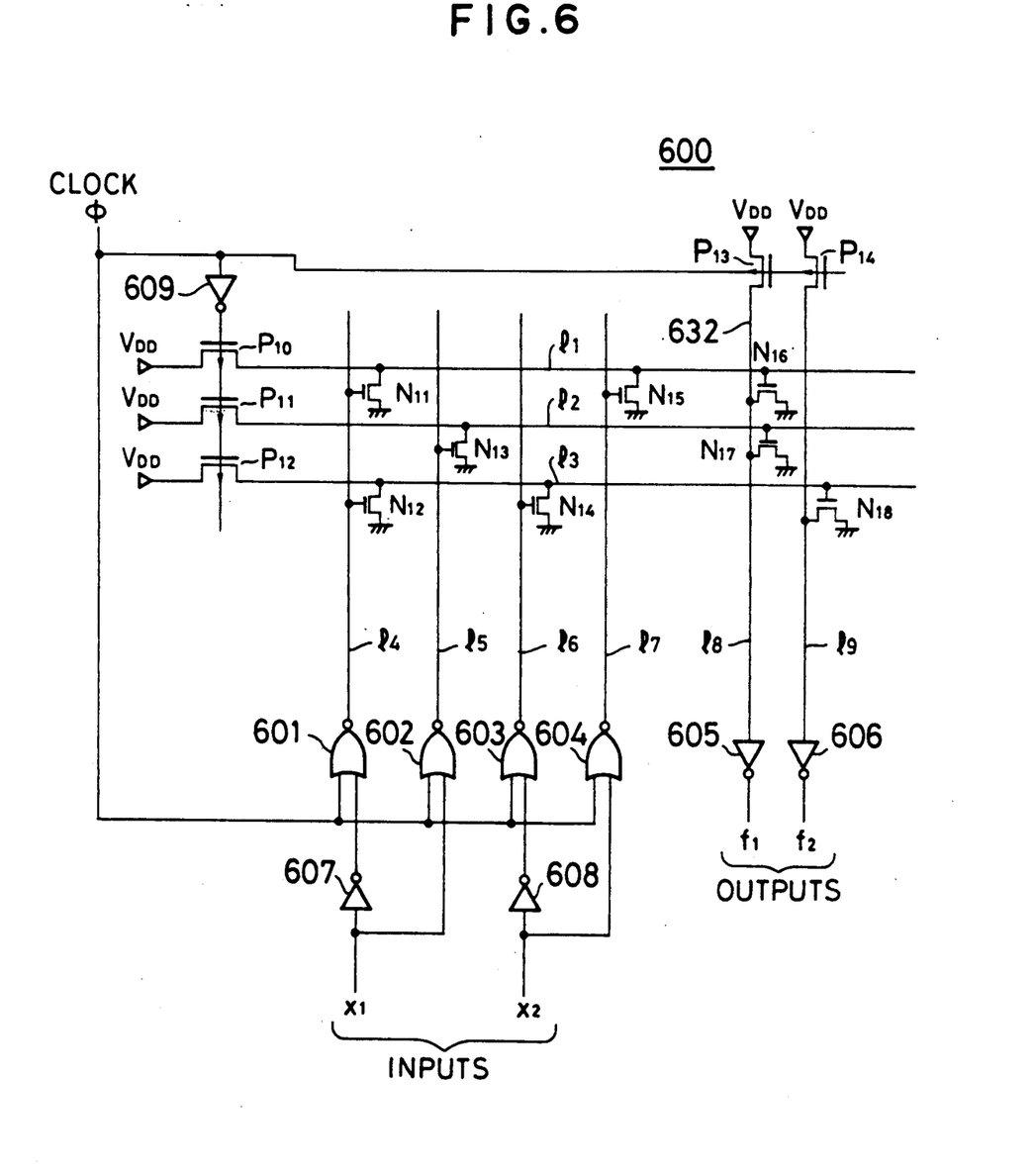
FIG. 6 is a diagram of a PLA which is a second embodiment of the present invention.

FIG. 6 is a diagram of PLA 600 which is a second embodiment of the present invention. PLA 600 of this embodiment has a construction in which the arrangement of NOR gates 601, 602, 603 and 604 in an input portion thereof is changed as compared with that portion of PLA 400 of the first embodiment further, new inverters 607 and 608 are added thereto.

Each input side of these inverters 607 and 608 is connected to one of the input sides of the NOR gates 602 and 604, and each output side of the former is connected to each of the input sides of the NOR gates 601 and 603.

Incidentally, when a clock $\phi$ is at the same level as input lines $l_4$, $l_5$, $l_6$ and $l_7$, the input lines $l_4$, $l_5$, $l_6$ and $l_7$ respectively output the input $x_1$, the inversion input $\bar{x}_1$ of the input $x_1$, the input $x_2$ and the inversion input $\bar{x}_2$ of the input $x_2$.

According to a PLA 600 having the above structure, the inputs $x_1$ and $x_2$ are inputted into the AND array at a higher speed than in the case of PLA 400.

Operation of inputs $x_1$, $x_2$ and the control clock $\phi$ in PLA 600 are completely the same as these of PLA 400, thus the explanation is omitted herein.

Figure 7:
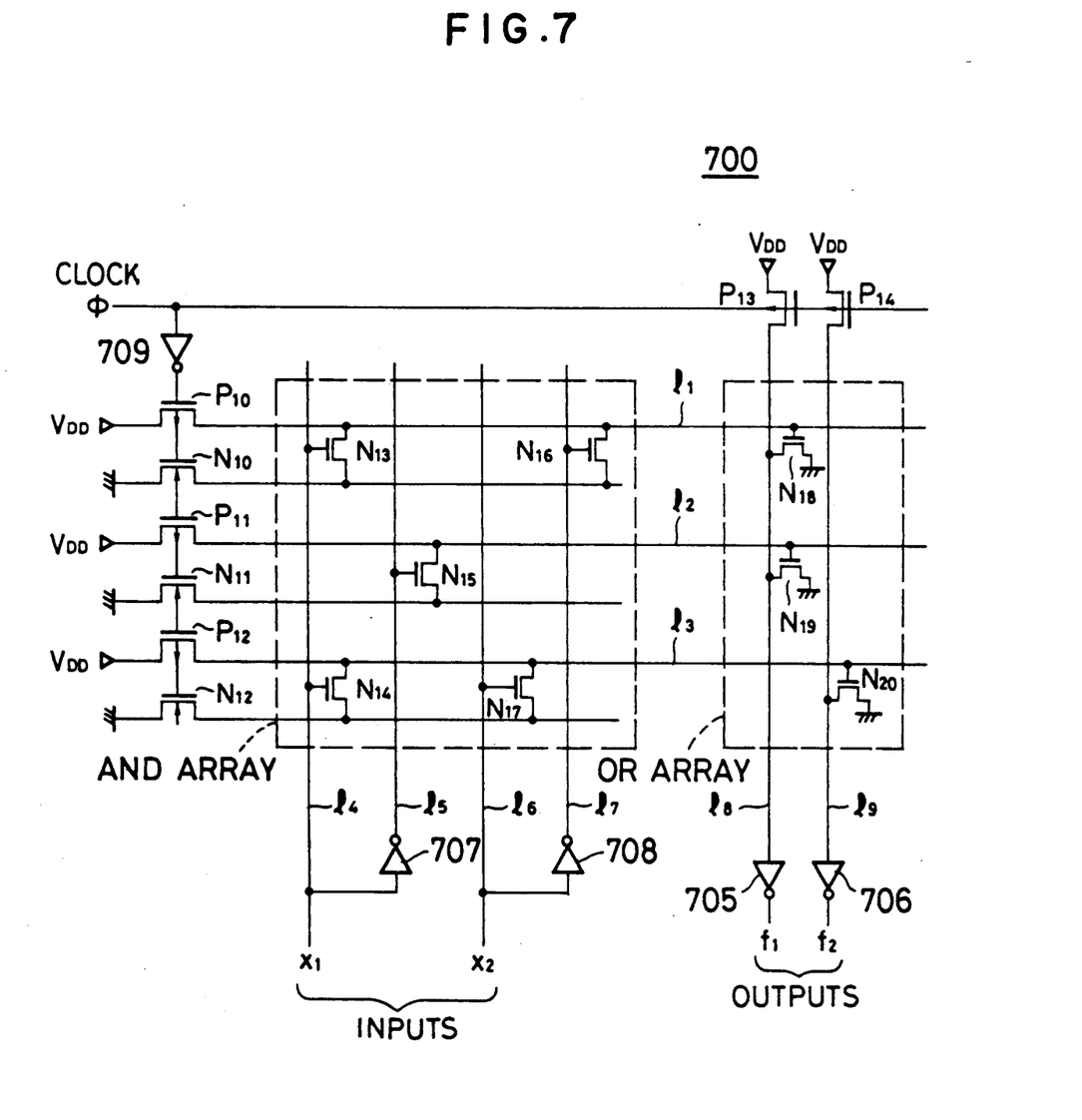
FIG. 7 is a diagram of a PLA which is a third embodiment of the present invention.

FIG. 7 is a diagram of PLA 700 which is a third embodiment of the present invention. In this embodiment, PMOS transistors $P_{10}$, $P_{11}$, $P_{12}$ are provided on the side of power sources $V_{DD}$ in an AND array. Product term lines $l_1$, $l_2$, $l_3$ are precharged by these PMOS transistors $P_{10}$, $P_{11}$ and $P_{12}$. This point is the same as the first and the second embodiment. Moreover, in this embodiment, each drain side of the NMOS transistors $N_{13}$ to $N_{17}$ connected to the product term lines $l_1$, $l_2$, $l_3$ is connected to each of the NMOS transistors $N_{10}$, $N_{11}$ and $N_{12}$. Each end terminal of these NMOS transistors $N_{10}$, $N_{11}$, and $N_{12}$ is connected to the ground. According to the above structure of PLA 700, the NOR gates 601, 602, 603 and 604 provided on the side of inputs $x_1$, $x_2$ in PLA 600 can be omitted.

Figure 8:
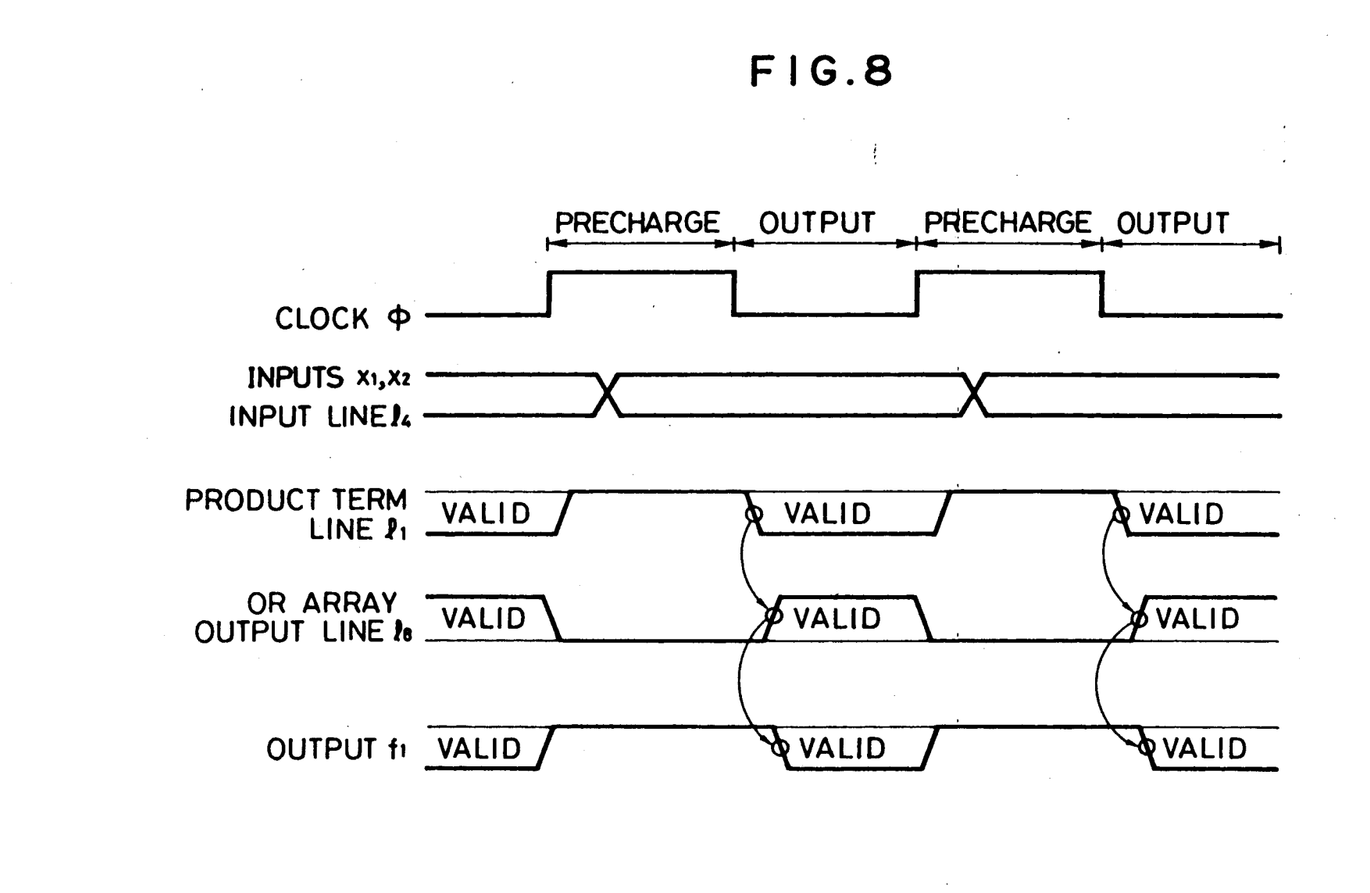
FIG. 8 is a timing chart to show operation of PLA shown in FIG. 7.

Next, the operation of PLA 700 of this embodiment will be described with reference to a timing chart shown in FIG. 8.

First, when a control clock $\phi$ is at the H level, the control clock $\phi$ supplies a L level (inverted clock $\bar{\phi}$) to each gate of the PMOS transistors $P_{10}$ to $P_{12}$ in the AND array. Thereby, PMOS transistors $P_{10}$ to $P_{12}$ turn ON. However, since the NMOS transistors $N_{10}$, $N_{11}$ and $N_{12}$ turn OFF, the product term lines $l_1$, $l_2$, $l_3$ go to the H level. Thereby, the product term lines $l_1$, $l_2$, $l_3$ are precharged.

All of the NMOS transistors $N_{18}$, $N_{19}$, $N_{20}$ in the OR array turn ON through the product term lines $l_1$, $l_2$, $l_3$ in the state of the H level. Moreover, PMOS transistors $P_{13}$ and $P_{14}$ are OFF in this case. Therefore, the NMOS transistors $N_{18}$, $N_{19}$, $N_{20}$ are discharged, and output lines $l_8$ and $l_9$ go to the L level.

Next, when the control clock $\phi$ changes from the H level to the L level, PMOS transistors $P_{10}$ to $P_{12}$ turn OFF and NMOS transistors $N_{10}$ to $N_{12}$ turn ON. Thus NMOS transistors $N_{13}$, $N_{14}$, $N_{15}$, $N_{16}$ and $N_{17}$ in the AND array turn OFF in accordance with input signals $x_1$, $x_2$ and inversion inputs $\bar{x}_1$, $\bar{x}_2$ from inverters 707 and 708. The product term lines $l_1$, $l_2$, $l_3$ carry out discharge or charge holding corresponding to the states of the NMOS transistors $N_{13}$ to $N_{16}$.

Since the PMOS transistors $P_{13}$ and $P_{14}$ turn ON, they act as a load on the output lines $l_8$, $l_9$ in the OR array. Thus, the output lines $l_8$, $l_9$ go to a L or H level, so that outputs $f_1$, $f_2$ are outputted through the inverters 705 and 706.

Figure 9:
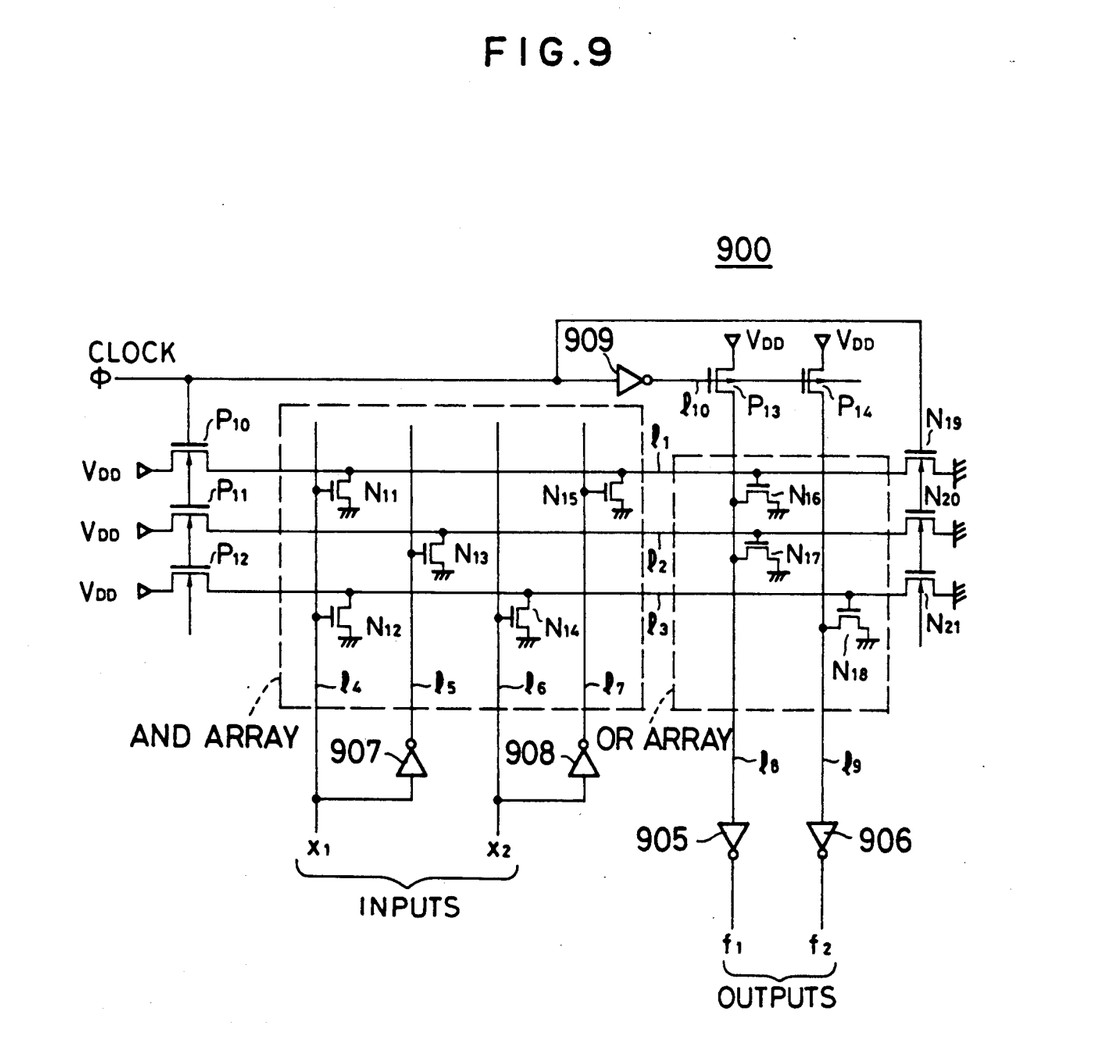
FIG. 9 is a compositional diagram of PLA which is a fourth embodiment of the present invention.

FIG. 9 is a diagram of PLA 900 which is a fourth embodiment of the present invention.

In this diagram, reference characters $P_{10}$ to $P_{14}$ designate PMOS transistors, and $N_{11}$ to $N_{21}$ designate NMOS transistors, further reference numerals 905 to 909 indicate inverters.

The PMOS transistors $P_{10}$, $P_{11}$ and $P_{12}$ act as load transistors during the outputs of output $f_1$ and $f_2$ (in case the control clock $\phi$ is at low level).

Figure 10:
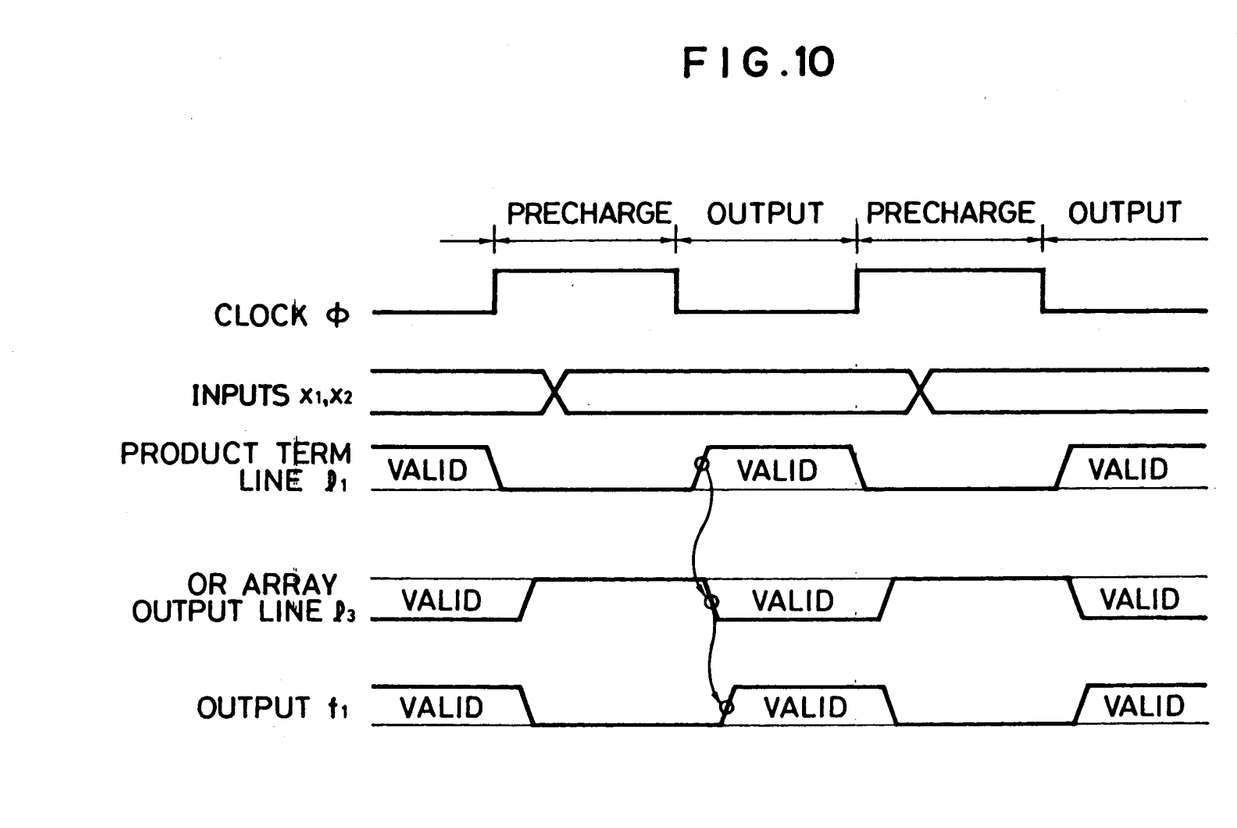
FIG. 10 is a timing chart to show operation of PLA shown in FIG. 9.

Next, operation of PLA 900 of this embodiment will be described.

While the control clock $\phi$ is at the H level, the PMOS transistors $P_{10}$ to $P_{12}$ turn OFF and the NMOS transistors $N_{19}$ to $N_{21}$ turn ON. Accordingly, product term lines $l_1$ to $l_3$ go to the L level, so that all of the NMOS transistors $N_{16}$ to $N_{18}$ in the OR array turn OFF a line $l_{10}$ on the output side of the inverter 909 goes to the L level, and the PMOS transistors $P_{13}$ and $P_{14}$ turn ON. Thus, the NMOS transistors $N_{16}$, $N_{17}$, $N_{18}$ each having a gate connected to the output lines $l_8$ or $l_9$ are precharged. Accordingly, in this case, there is not a current path from the power source $V_{DD}$ to the ground through the NMOS transistors $N_{11}$ to $N_{18}$ in the AND array and the OR array.

When inputs $x_1$, $x_2$ are applied while the clock $\phi$ is at an H level, the levels of the input lines $l_4$ to $l_7$ are determined by the inversion outputs $\bar{x}_1$, $\bar{x}_2$ of the inverters 907 and 908. When the clock $\phi$ changes from the H level to the L level, the NMOS transistors $N_{19}$, $N_{20}$, $N_{21}$ turn OFF, and the PMOS transistors $P_{10}$, $P_{11}$, $P_{12}$ turn ON, further the product term lines $l_1$, $l_2$, $l_3$ go to the H or L level in accordance with the contents of the inputs $x_1$, $x_2$ and the inversion inputs $\bar{x}_1$, $\bar{x}_2$. As a result, the levels of the product term lines $l_1$, $l_2$, $l_3$ are transmitted to the OR array, and the NMOS transistors $N_{16}$, $N_{17}$, $N_{28}$ turn ON or OFF. Thus, the output lines $l_8$ and $l_9$ carry out discharge or charge holding of a precharged charge, and outputs $f_1$, $f_2$ are outputted through the inverters in accordance with these states.

In the above PLAS 400, 600, 700 which are embodiments of the present invention, the L level of the output line in the OR array (e.g. low level of the output line $l_8$ in FIG. 4) is determined by a ratio of the ON resistance values in the ON states of the PMOS transistor (e.g. $P_{13}$ in FIG. 4) whose source electrode is connected to the power source $V_{DD}$ to the OR array and the NMOS transistor (e.g. $N_{16}$ in FIG. 4) of the OR array. In order to obtain the L level signal, the ON resistance of the former PMOS transistor should be large. Therefore, the ratio of the gate width W and the gate length L of the PMOS transistor, i.e., W/L, is so set as to be smaller than the W/L of the PMOS transistor whose gate is connected to the power source to the AND array (e.g. $P_{10}$ in FIG. 4).

While, in PLA 900 shown in FIG. 9, since low level of the product term line $l_1$ is determined by a ratio of the ON resistance values of the PMOS transistor $P_{10}$ and the NMOS transistor $N_{11}$, the ON resistance of the $P_{10}$ should be large. Thus, W/L of the PMOS transistor in the AND array (e.g. $P_{10}$) is set so as to be smaller than that of the PMOS transistor in the OR array (e.g. $P_{13}$).

In the above mentioned embodiments, although a single-phase control clock is directly provided to $P_{13}$ and $P_{14}$ in PLA400, PLA600, and PLA700 and $P_{10}$, $P_{11}$, and $P_{12}$ in PLA900, for example, a non-inverted clock $\phi$ through an even number of inverters may also be used.

As is apparent from the above embodiments according to the present invention, since only a single-phase clock is used in the present invention, there is no need to generate and control two-phase clocks so as not to cause overlap. Additionally, the clock frequency may be made to higher improve high-speed operation.

Moreover, a PLA according to the present invention is so constructed that a fixed current does not flow in one of the AND array and the OR array thereof while the other of the AND array and the OR array is precharged. Thus, consumption of electric power in the entire PLA can be controlled to be low.

Various modifications will become possible for those skilled in the art front the teachings of the present disclosure without departing from the scope of the claims.

What is claimed is:

1. A programable logic array, comprising:
    an AND array and an OR array respectively composed of a plurality of second conductivity type MOS transistors;
    a plurality of first conductivity type MOS transistors of a first group each having one terminal connected to an electrical power source for supplying a predetermined voltage; and
    a plurality of first conductivity type MOS transistors of a second group each having one terminal connected to said electrical power source,
    wherein a true single clock signal is supplied to gate terminals of said first conductivity type MOS transistors of said second group;
    a complementary clock signal of said true single clock signal is supplied to gate terminals of said first conductivity type MOS transistors of said first group; and
    wherein a ratio of gate width W and gate length L, i.e., W/L, of each of said first conductivity type MOS transistors of said second group is smaller than that of said first conductivity type MOS transistors of said first group.

2. A programable logic array according to claim 1, wherein said first conductivity type MOS transistors are P channel type MOS transistors and said second conductivity type MOS transistors are N channel type MOS transistors.

3. A programable logic array, comprising:
    an AND array and an OR array respectively composed of a plurality of second conductivity type MOS transistors;
    a plurality of first conductivity type MOS transistors of a first group each having one terminal connected to an electrical power source for supplying a predetermined voltage; and
    a plurality of first conductivity type MOS transistors of a second group each having one terminal connected to said electrical power source,
    wherein a true single clock signal is supplied to gate terminals of said first conductivity type MOS transistors of said first group;
    a complementary clock signal of said true single clock signal is supplied to gate terminals of said first conductivity type MOS transistors of said second group; and
    wherein a ratio of gate width W and gate length L, i.e., W/L, of each of said first conductivity type MOS transistors of said first group is smaller than that of each of said first conductivity type MOS transistors of said second group.

4. A programable logic array according to claim 3, wherein said first conductivity type a MOS transistors are P channel type MOS transistors and said second conductivity type MOS transistors are N channel type MOS transistors.

5. A programable logic array, comprising:
    a plurality of first conductivity type MOS transistors of a second group each having a gate terminal and two other terminals, each said gate terminal of which receives a true single clock signal, and one of said other terminals being connected to an electrical power source;

a OR array comprising a plurality of second conductivity type MOS transistors having a gate terminal and two other terminals, each said gate terminal of which is connected to one of a plurality of product term lines, and one of said other terminals of which is connected to a respective output line, another terminal of which is connected to ground;

a plurality of first conductivity type MOS transistors of a first group each having a gate terminal thereof receiving a complementary clock signal of said true single clock signal; and an AND array comprising a plurality of second conductivity type MOS transistors each having a gate terminal and two other terminals, each said gate terminal receiving an input signal, one of said two other terminals of which is connected to one of said first conductivity type MOS transistors through one of said product term lines, another terminal of which is connected to ground;

whereby discharge and charge holding of said second conductivity type MOS transistors in said AND array and said OR array are carried out in accordance with levels of said input signal and said single control clock signal, a stationary current is controlled so as to not flow in one array of said arrays during charge holding in the other array, and an output value of said OR array is outputted corresponding to said input signal, wherein a ratio of gate width W and gate length L, i.e., W/L, of each of said first conductivity type MOS transistors of said second group is smaller than that of each of said first conductivity type MOS transistors of said first group.

6. A programable logic array according to claim 5, wherein said first conductivity type MOS transistors are P channel type MOS transistors and said second conductivity type MOS transistors are N channel type MOS transistors.

7. A programable logic array, comprising:

a plurality of first conductivity type MOS transistors of a second group each having a gate terminal and two other terminals, each said gate terminal receiving a true single control clock signal, and one of said other terminals connected to an electrical power source;

an OR array comprising a plurality of second conductivity type MOS transistors each having a gate terminal and two other terminals, each said gate terminal of said second conductivity type transistors connected to one of a plurality of product term lines, and one of said other terminals connected to a respective output line, with another terminal connected to ground;

a plurality of first conductivity type MOS transistors of a first group having a gate terminal and two other terminals, each said gate terminal thereof receiving a complementary clock signal of said true single clock signal; and an AND array comprising a plurality of second conductivity type MOS transistors having a gate terminal and two other terminals, each said gate terminal of which receives an input signal, one of said two other terminals of which is connected to one of said first conductivity type MOS transistors through one of said product term lines, with another terminal of which connected to ground;

whereby discharge and charge holding of said second conductivity type MOS transistors in said AND array and said OR array are carried out in accordance with levels of said input signal and said single control clock signal, a stationary current is controlled so as to not flow in one array of both said arrays during charge holding in the other array, and an output value of said OR array is outputted corresponding to said input signal, wherein a ratio of gate width W and gate length L, i.e., W/L, of each the said first conductivity type MOS transistors of said first group is smaller than that of each of said first conductivity type MOS transistors of said second group.

8. A programable logic array according to claim 7, wherein said first conductivity type MOS transistors are P channel type MOS transistors and said second conductivity type MOS transistors are N channel type MOS transistors.

* * * * *